United States Patent
Lictao, Jr. et al.

(10) Patent No.: US 10,297,500 B2
(45) Date of Patent: May 21, 2019

(54) SEMICONDUCTOR WAFER DICING METHOD

(71) Applicant: Nexperia B.V., Nijmegen (NL)

(72) Inventors: Crispulo Estira Lictao, Jr., Laguna (PH); Pitak Seantumpol, Bangkok (TH); Siriluck Wongratanaporngoorn, Bangkok (TH); Matthew Mondala Fernandez, Cabuyao (PH); Amileth Dejan Cabrera, Cabuyao (PH)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 15/379,495

(22) Filed: Dec. 15, 2016

(65) Prior Publication Data
US 2018/0174907 A1    Jun. 21, 2018

(51) Int. Cl.
| | |
|---|---|
| *H01L 27/12* | (2006.01) |
| *H01L 21/3213* | (2006.01) |
| *H01L 21/78* | (2006.01) |
| *H01L 21/304* | (2006.01) |

(52) U.S. Cl.
CPC .......... *H01L 21/78* (2013.01); *H01L 21/3043* (2013.01)

(58) Field of Classification Search
USPC ......................................... 257/620
See application file for complete search history.

(56) References Cited

U.S. PATENT DOCUMENTS

| | | |
|---|---|---|
| 5,609,148 A | 3/1997 | Mitwalsky et al. |
| 5,718,615 A | 2/1998 | Boucher et al. |
| 5,786,266 A | 7/1998 | Boruta |
| 6,319,354 B1 | 11/2001 | Farnworth |
| 6,357,330 B1 | 3/2002 | Dass et al. |
| 7,220,619 B2 | 5/2007 | Ho et al. |
| 2001/0024300 A1* | 9/2001 | Sasahara ............... H01L 25/042 358/482 |
| 2002/0052169 A1* | 5/2002 | Vepa .......................... B24B 1/00 451/11 |
| 2011/0198817 A1* | 8/2011 | Hurley .............. H01L 21/67092 279/3 |
| 2014/0127882 A1* | 5/2014 | Sekiya .................... H01L 21/78 438/462 |
| 2015/0332970 A1* | 11/2015 | Lei .......................... H01L 21/82 438/462 |
| 2016/0148842 A1* | 5/2016 | Ho .......................... H01L 21/78 257/620 |

\* cited by examiner

*Primary Examiner* — Marcos D. Pizarro
*Assistant Examiner* — Lawrence C Tynes, Jr.
(74) *Attorney, Agent, or Firm* — Ohlandt, Greeley, Ruggiero & Perle, L.L.P.

(57) ABSTRACT

A method of dicing a bowed or warped semiconductor wafer includes cutting along the saw streets in a first direction on a first half of the wafer, where the first direction is parallel to the bowing, cutting along the saw streets in the first direction on a second half of the wafer opposite to the first half, and step-cutting along the saw streets in the second direction, such that all of the dies are separated from each other, and the sides of the die in the bowing direction are flat and the sides of the die perpendicular to the bowing direction are stepped.

13 Claims, 2 Drawing Sheets

SEMICONDUCTOR WAFER DICING METHOD

BACKGROUND

The present invention is directed to semiconductor wafers and, more particularly, to a method of dicing semiconductor wafers.

Integrated circuit dies are formed on semiconductor wafers. Depending on the dimensions of the wafer and the processes and materials used for forming the dies on the wafer, as well as any environmental conditions to which the wafer may be exposed, the wafer may experience some warping or bowing. For example, some wafer bowing is inherent for wafers that embody deep trench technologies. FIG. 1 shows an example of a bowed wafer 10 having a plurality of integrated circuit dies 12 formed thereon. As can be seen, the wafer 10 is warped or includes a bow 14. Bowed wafers mounted to a tape experience high residual stress, such that when dicing the wafer, die chipping may occur, which decreases yield and therefore is costly.

It would be advantageous to be able to singulate the dies formed on a wafer without excessive chipping, and thereby providing for better yield.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale.

DETAILED DESCRIPTION

The present invention provides a method of dicing or singulating a semiconductor wafer into a plurality of dies, where the wafer comprises a plurality of dies arranged in a matrix on the wafer. The dies are separated by saw streets that run in first and second directions, with the second direction being perpendicular to the first direction. The method includes the steps of cutting along the saw streets in the first direction on a first half of the wafer, cutting along the saw streets in the first direction on a second half of the wafer opposite to the first half, and step-cutting along the saw streets in the second direction such that all of the dies are separated from each other, and the sides of the dies parallel to the first direction are flat and the sides of the dies perpendicular to the first direction are stepped.

In another embodiment, the present invention provides a semiconductor die that has been cut from a wafer. The die has an integrated circuit formed therein, and includes a top planar surface, a bottom planar surface opposite to the top planar surface, first and second sides that extend between the top and bottom surfaces, wherein the first and second sides are opposite to each other and are flat, and third and fourth sides that extend between the top and bottom surfaces, wherein the third and fourth sides are opposite to each other, and wherein the third and fourth sides are stepped such that a length of the bottom surface is greater than a length of the top surface.

Figure 1:
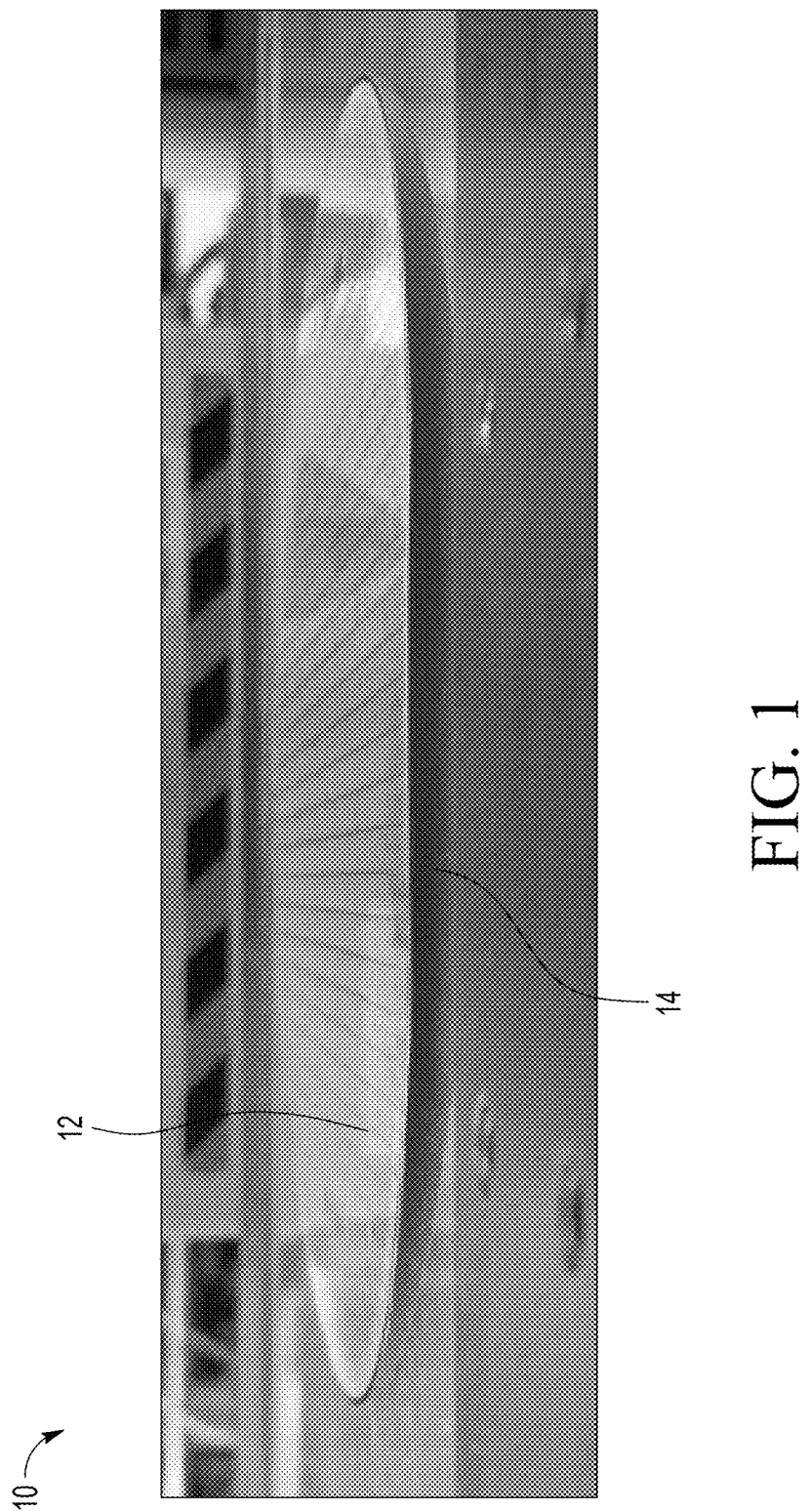
FIG. 1 is a photograph of a bowed semiconductor wafer.
Figure 2A:
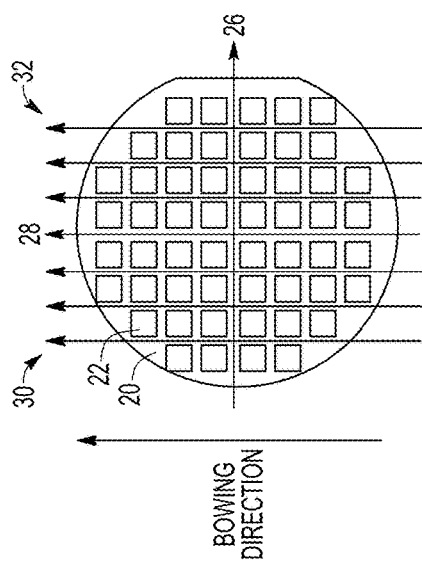
FIGS. 2A, 2B and 2C are top plan views of a wafer illustrating the steps of wafer dicing in accordance with a preferred embodiment of the present invention.

Referring now to FIG. 2A, a top plan view of a wafer 20 including an array of semiconductor dies 22 is shown. The dies 22 are formed in rows and columns and separated by saw streets, as is known by those of skill in the art. The wafer 20 is generally circular and typically includes one straight edge 24 used to orient the wafer 20. As previously discussed, as wafers become thinner and larger, they can be subject to warping or bowing. While the invention disclosed herein is particularly useful for bowed wafers, it will be understood by those of skill in the art that the invention may be practiced on wafers that are not bowed. In FIG. 2A, the example wafer 20 is bowed and the bowing is in the direction shown by the arrow on the left side of the wafer.

First, prior to dicing the wafer 20, the wafer 20 is secured to a dicing tape with a film frame carrier. The wafer may be secured to the carrier with an adhesive and/or with vacuum pressure, as is known in the art. Since dicing tapes and film frame carriers are known in the art, and modifications to known carriers are not required in order to practice the present invention, further description thereof is not necessary for a complete understanding of the present invention.

In a first step, a first cut 26 is made along a saw street in a first direction and through a center of the wafer 20, which divides the wafer 20 into first and second halves. In the presently preferred embodiment, the first cut 26 is made perpendicular to the direction of the bowing and extends entirely through the wafer 20. Then, a second cut 28 is made along a saw street that is perpendicular to the first cut (and therefore in the direction of the bowing). The second cut 28 also passes through the center of the wafer 20, and thus the wafer 20 is separated into quarters. In the presently preferred embodiment, the first and second cuts 26 and 28 are performed using the same saw blade and cut to the same depth. The first and second cuts 26 and 28 are believed to reduce residual stress on the wafer 20 caused by the bowing.

Figure 2B:
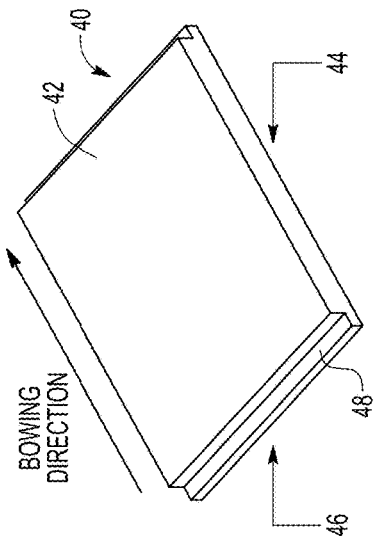

FIG. 2B is a top plan view of the wafer 20 after being quartered by the first and second cuts 26 and 28. After the quartering, the wafer 20 is cut along the saw streets in the bowing direction on one side or a first half of the wafer 20 in a first step 30, and then cut along the saw streets in the bowing direction on the other or second, opposite half of the wafer 20 in a second step 32. In the presently preferred embodiment, the first and second steps are performed simultaneously. Although not required, in the presently preferred embodiment, the cuts 30 are made using the same saw blade as was used for quartering the wafer 20, while the cuts 32 are made using a thinner saw blade or a saw blade with a smaller kerf.

Figure 2C:
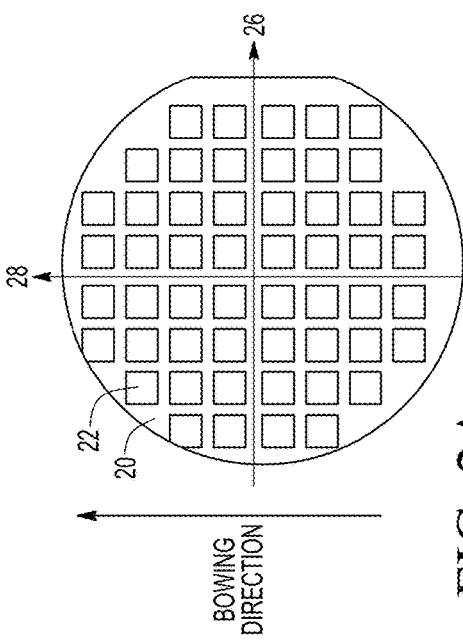

FIG. 2C is a top plan view of the wafer 20 illustrating a next step in which the wafer 20 is cut in a direction perpendicular to the bowing direction, after the cuts 30 and 32 are made in the bowing direction. The cuts perpendicular to the bowing are illustrated with arrows 34. The cuts 34 comprise step-cuts, and these step cuts separate the dies 22 from each other. The step-cutting comprises making a first cut along the saw streets in the direction perpendicular to the bowing direction with the thicker saw blade to a first depth, and then making a second cut along the saw streets in the same direction with the thinner saw blade to a second depth, which is the depth required to cut through the wafer 20.

The depth of the first cut made with the thicker saw blade ranges from about 50% to 80% of the wafer thickness, and preferable from 70%-80% of the wafer thickness. Further, the first saw blade has a thickness ranging from about 20 to 25 μm, and the second saw blade has a thickness ranging from 15 to 20 μm, although it is understood that the different blade widths will be within the saw street or scribe lane of the wafer 20. Such size saw blades used for semiconductor wafer dicing are commercially available. Accordingly, a die separated using the described method has sides parallel to the bowing direction that are flat and the sides perpendicular to the bowing direction that are stepped.

Figure 3:
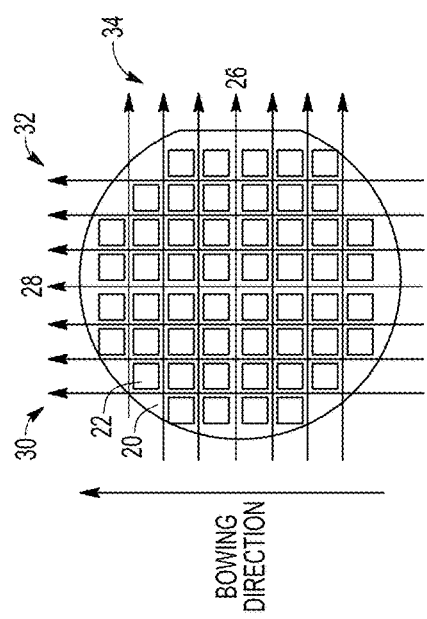
FIG. 3 is an isometric view of an integrated circuit die cut from a semiconductor wafer in accordance with an embodiment of the present invention.

FIG. 3 shows a semiconductor die 40 that has been cut from a wafer using the above-described method. The die 40 has a top planar surface 42, and a bottom planar surface opposite to the top planar surface. The die 40 also has first and second sides 44 that extend between the top and bottom surfaces. The first and second sides 44 are opposite to each other and are flat, as shown in FIG. 3. There also are third and fourth sides 46 that extend between the top and bottom surfaces. The third and fourth sides 46 are opposite to each other, and are stepped such that a length of the bottom surface is greater than a length of the top surface. Using the step-cut process described above forms stepped sides have one step, and since the depth of the first cut, with the thicker saw blade is about 70-80% of the thickness of the wafer, then a distance from the top surface 42 to the step 48 is greater than a distance from the bottom surface to the step 48.

The invention is applicable to all bowed wafers to attain dies with good chipping quality. Application of a step-cut perpendicular to direction of the bowing of the wafer bowing has been found to prevent severe back chipping.

In the foregoing specification, the invention has been described with reference to specific examples of embodiments of the invention. It will, however, be evident that various modifications and changes may be made therein without departing from the broader spirit and scope of the invention as set forth in the appended claims.

In the claims, the words 'comprising', 'including', and 'having' do not exclude the presence of other elements or steps then those listed in a claim. The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A method of dicing a semiconductor wafer, wherein the wafer comprises a plurality of dies arranged in a matrix on the wafer, wherein the dies are separated by saw streets that run in a first direction and a second direction perpendicular to the first direction, the method comprising:
   cutting along the saw streets in the first direction on a first half of the wafer;
   cutting along the saw streets in the first direction on a second half of the wafer opposite to the first half; and
   step-cutting along the saw streets in the second direction, whereby all of the dies are separated from each other, and the sides of the dies parallel to the first direction are flat and the sides of the dies perpendicular to the first direction are stepped,
   wherein the step-cutting comprises making a first cut along the saw streets in the second direction with a first saw blade having a first thickness and to a first depth, and a second cut along the saw streets in the second direction with a second saw blade having a second thickness and to a second depth,
   wherein the first thickness is greater than the second thickness, and
   wherein the first saw blade has a thickness ranging from 20 to 25 um.

2. The method of claim 1, wherein the first depth ranges from 70% to 80% of the wafer thickness.

3. The method of claim 1, wherein the second saw blade has a thickness ranging from 15 to 20 um.

4. The method of claim 1, wherein cutting along the saw streets in the first direction on the first half of the wafer is performed using the first saw blade having the first thickness.

5. The method of claim 4, wherein cutting along the saw streets in the first direction on the second half of the wafer is performed using the second saw blade having the second thickness different from the first thickness.

6. The method of claim 1, further comprising, prior to cutting along the saw streets in the first direction on the first half of the wafer, making a first cut along a saw street in the second direction and through a center of the wafer to separate the wafer into the first and second halves.

7. The method of claim 6, further comprising after making the first cut and before cutting along the saw streets in the first direction on the first half of the wafer, making a second cut along a saw street in the first direction and through the center of the wafer to separate the wafer into quarters.

8. The method of claim 1, wherein prior to making the first cut, the wafer is secured to a dicing tape with a film frame carrier.

9. The method of claim 8, wherein the wafer is secured to the carrier with an adhesive.

10. The method of claim 8, wherein the wafer is secured to the carrier with vacuum pressure.

11. A semiconductor die formed by the method of claim 1.

12. A semiconductor die having an integrated circuit formed therein, comprising:
   a top planar surface;
   a bottom planar surface opposite to the top planar surface;
   first and second sides that extend between the top and bottom surfaces, wherein the first and second sides are opposite to each other and are flat; and
   third and fourth sides that extend between the top and bottom surfaces, wherein the third and fourth sides are opposite to each other, and wherein the third and fourth sides are stepped such that a length of the bottom surface is greater than a length of the top surface,
   wherein a distance from the top surface to the step is greater than a distance from the bottom surface to the step; and
   wherein the distance from the top surface to the step ranges from 20 to 25 um.

13. The semiconductor die of claim 12, wherein the stepped sides have one step.

* * * * *